Figure 1:
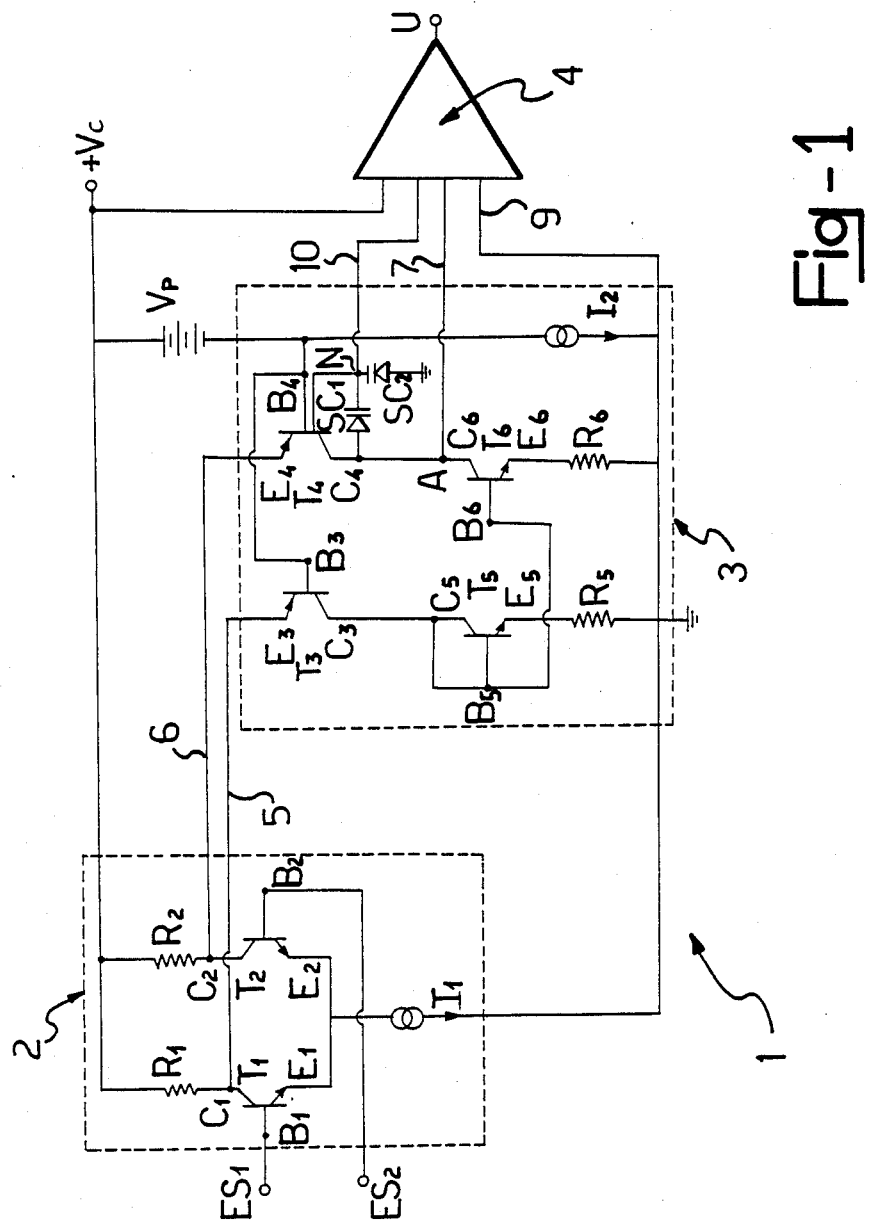

United States Patent [19]
Gola

[11] Patent Number: 4,751,474
[45] Date of Patent: Jun. 14, 1988

[54] BROADBAND AMPLIFIER INCORPORATING A CIRCUIT DEVICE EFFECTIVE TO IMPROVE FREQUENCY RESPONSE

[75] Inventor: Alberto Gola, Broni, Italy

[73] Assignee: SGS-Thomson Microelectronics S.p.A., Italy

[21] Appl. No.: 944,584

[22] Filed: Dec. 22, 1986

[30] Foreign Application Priority Data

Feb. 28, 1986 [IT] Italy ............................. 19595A/86

[51] Int. Cl.$^4$ ............................................. H03F 3/26
[52] U.S. Cl. .................................... 330/292; 330/255; 330/265; 330/307
[58] Field of Search ............... 330/156, 255, 265, 271, 330/307, 292

[56] References Cited

PUBLICATIONS

Maillet, "General Purpose Operational Amplifier", IBM Technical Disclosure Bulletin, vol. 21, No. 4, Sep. 1978, pp. 1451, 1452.

Primary Examiner—James B. Mullins
Attorney, Agent, or Firm—Jones, Askew & Lunsford

[57] ABSTRACT

A broadband amplifier comprising insulated collector vertical pnp transistors, a circuit device effective to improve frequency response, and a final stage comprising a so-called complementary pair formed of an npn transistor and a pnp transistor having emitters connected to each other and to an epitaxial layer n of the insulated collector vertical pnp transistor incorporated in the gain circuit of said amplifiers. The complementary pair afford minimization of the junction parasitic capacitances of the aforesaid vertical pnp transistor.

1 Claim, 2 Drawing Sheets

BROADBAND AMPLIFIER INCORPORATING A CIRCUIT DEVICE EFFECTIVE TO IMPROVE FREQUENCY RESPONSE

DESCRIPTION

This invention relates to a broadband amplifier incorporating a circuit device effective to improve frequency response.

In particular, this broadband amplifier is of a type which comprises inculated collector vertical pnp transistors.

Advantageously, this amplifier includes a gain circuit having a transistor of the insulated collector vertical pnp type provided with a terminal for the n epitaxial layer, and an output circuit having a final stage comprised of a complementary pair with interconnected emitters.

Specifically, the improved frequency response of the amplifier, with which this invention is concerned, is achieved by means of a circuit device which minimizes the parasitic junction capacitances of the vertical pnp transistor incorporated to the gain circuit.

As is known, pnp transistors would indeed find widespread application to broadband amplifiers on account of some design simplifications brought about by their use, if such transistors had good frequency response characteristics.

Current technologies have made so-called insulated collector, vertical pnp transistors available which have good frequency response characteristics; however, their high overall parasitic junction capacitance, as seen from the collector toward ground, still constitutes a serious limiting factor in the use of insulated vertical pnp's in that is jeopardizes their high-frequency response performance.

In particular, parasitic capacitances are apt to limit the signal amplification to below a certain frequency.

The physical structure of an insulated collector vertical pnp transistor involves the appearance of two parasitic capacitances of significance, as seen from the collector toward ground, namely;

a first junction capacitance SC1 present between the p+ doped layer of the collector and the n epitaxial layer which isolates the collector from the grounded p substrate of the transistor; and a second parasitic junction capacitance SC2 present between the n epitaxial layer and said p substrate.

Due to the extend of such junctions and highly doped p regions, such capacitances may be as high as about 7 pF and 6 pF, respectively, at zero volts.

A known technical approach to minimization of such parasitic capacitances provides, for example, for the terminal of the n epitaxial layer to be connected to the transistor collector, thus shorting out the capacitance SC1, but leaving SC2 unaffected.

Another prior approach provides for connection of the n epitaxial layer terminal to the positive power supply pole, thus cancelling the effect of the capacitance SC2, but still retaining the contribution from SC1.

Therefore, both of the above prior approaches, while lowering the overall value of the parasitic junction capacitances, have the disadvantage that they fail to reduce that value as required, and in particular, the latter prior approach has the added disadvantage of being often unpracticable because the junction between the epitaxial layer, as so biased, and the pnp transistor collector is liable to breakdown at low voltage values.

A third prior approach, as disclosed in U.S. patent application Ser. No. 882,295 filed July 6, 1986, provides a so-called "bootstrap" circuit comprising an emitter follower, vertical pnp transistor having emitter and base terminals which are respectively connected to the epitaxial layer terminal and the collector of the insulated collector transistor.

Such a circuit, while substantially achieving its object of lowering the parasitic capacitances, has the disadvantage that it can only operate properly with small signals, whereas with high amplitude signals, it would just be able to follow correctly the pattern of the signal negative halfwaves.

The problem underlying this invention is that of minimizing the overall parasitic capacitances of insulated collector vertical pnp transistors as incorporated to a broadband amplifier by means of a circuit device, also incorporated to the amplifier and capable of following both halfwaves of a high amplitude signal, to overcome the cited drawbacks affecting the prior art.

This problem is solved, according to the invention, by a broadband amplifier comprising a circuit device effective to improve frequency response, and being of a type which includes a gain circuit having a transistor of the insulated collector vertical pnp type provided with a terminal for the n epitaxial layer, and an output circuit having a final stage comprised of a complementary pair formed of npn and pnp transistors with interconnected emitters, characterized in that it comprises an additional complementary pair formed of two transistors, being powered in said output circuit, and having emitters connected to each other and, through a lead, to said n epitaxial layer terminal of the pnp transistor incorporated to the gain circuit.

The features and advantages of the inventive device will be better understood from the following description of an embodiment thereof, given by way of example and not of limitation with reference to the accompanying drawings.

Figure 2:
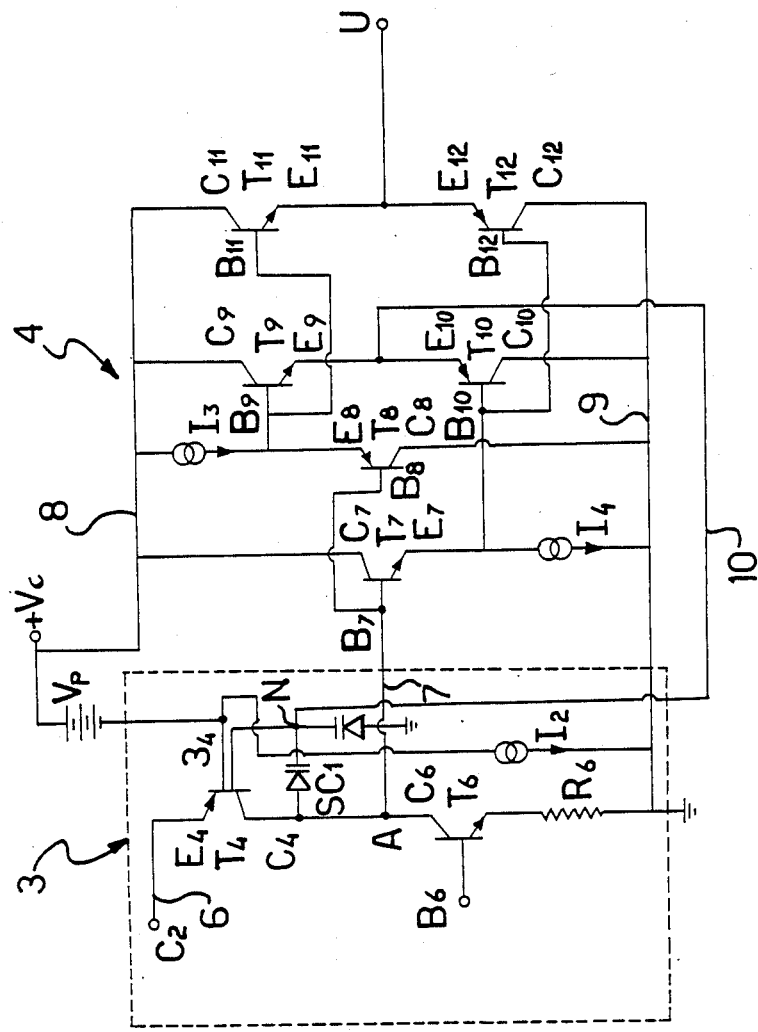

In the drawings:

FIG. 1 shows schematically a broadband amplifier comprising vertical pnp transistors; and FIG. 2 is a detail veiw of the device of this invention also showing it connections to the amplifier.

With reference to the drawing figures, the numeral 1 designates generally a broadband amplifier consisting of three stages, namely: a differential amplifier 2, gain circuit 3, and low-impedance output circuit 4.

In particular, included within the output circuit 4 is a device according to this ivnention.

The differential amplifier 2 is a conventional design and amplifies voltage differences. To this aim, it comprises a pair of input terminals ES1 and ES2 which are respectively connected to the base B1 and the base B2 of a transistor pair T1 and T2 which are structurally identical and of the npn type, the transistors T1 and T2 having their emitters E1 and E2 connected to each other and their collectors C1 and C2 connected to a positive pole of the electric power supply Vc respectively via a resistor R1 and a resistor R2 of like values.

The emitters E1 and E2 are also grounded through a constant current generator I1 of conventional design and referred to as the bias generator.

The differntial amplifier 2 as such is connected to said gain circuit 3 by schematical functional connections 5 and 6 which join respectively said collector C1 to the emitter E3 of a transistor T3, and said collector C2 to the emitter E4 of a transistor T4; said transistors T3 and T4 having respective bases B3 and B4 which are interconnected.

The transistors T3 and T4 are of the high cut-off frequency, insulated collector, vertical pnp type. The transistor T4 has its emitter E4 connected to a p-doped region of its structure, not shown in the drawing, its base B4 connected to an n+ region, and its collector C4 connected to a p+ region. Furthermore, T4 is provided with a terminal N, as shown in FIG. 2, connected to the n epitaxial layer of the transistor. Details of such transistors are known in the art, for example, as shown in U.S. Pat. No. 4,038,680.

The base B4 of the transistor T4 is connected to both the power supply pole VC through a voltage source Vp, and to ground through a current source I2, said sources forming bias generators.

The collectors C3 and C4 of the transistors T3 and T4 are respectively joined to the collectors C5 and C6 of a transistor pair T5 and T6 of the npn type; accordingly, the so-joined transistors T5 and T6 will form a so-called current mirror.

The transistors T5 and T6 have interconnected bases B5 and B6, and the transistor T5 also has its base B5 and collector C5 shorted out; both transistors, moreover, have their emitters, E5 and E6, grounded via a resistor R5 and a resistor R6, respectively.

With specific reference to the embodiment shown in FIG. 2, the transistor T4 comprises, according to this invention, a first junction parasitic capacitance SC1 between the p+ region of the collector and the n epitaxial layer, and a second parasitic capacitance SC2 between a grounded insulative p+ region and that same n epitaxial layer.

Between the collectors C4 and C6, and electrically coincident therewith, is a node A which forms an input terminal for said low-impedance output ciruict 4 of the broadband amplifier 1.

The node A is connected by a lead 7 to the base B7 of a transistor T7 of the npn type which has its collector C7 connected to a conducting line 8, in turn connected to the power supply Vc, and its emitter E7 connected to a conducting line 9, and hence to ground, with the intermediary of a bias current generator I4.

The base B7 is connected to the base B8 of a transistor T8 of the pnp type having its collector C8 grounded through the line 9 and its emitter E8 connected to said line 8 through a bias current generator I3.

Indicated at T9 and T10 are two transistors of the npn and pnp types, respectively, which form a complementary pair device having joined emitters E9 and E10, according to the invention, and constituting, therefore, a first complementary pair of transistors powered in the final stage of the output circuit 4.

The transistor T9 has its base B9 connected to the emitter E8 and the base B11 of a transistor T11 of the npn type and being the first member of a second complementary pair of transistors comprising transistors T11 and T12 and forming the final stage of the output circuit 4 in accordance with the prior art.

The transistor T10 has its base B10 connected to the emitter E7 and to the base B12 of the pnp-type transistor T12.

The transistor T9 has its collector C9 connected to said line 8, whereas the transistor T10 has its collector C10 grounded over the line 9.

The emitters E9 and E10 are jointly connected, according to the invention, by a lead 10, to the n epitaxial layer of the transistor T4 incorporated to the gain circuit 3.

Lastly, the complementary transistor pair T11, T12 have their emitters E11 and E12 joined together and connected to an output terminal U, the collectors, C11 and C12, being connected to the line 8 and the line 9, respectively.

The device of this invention operates as follows.

The differential amplifier 2 and gain circuit 3, being cascade-connected, produce at the node A a voltage level which is amplified by about 80 db over the amplitude of a voltage signal appearing at the input terminals ES1 and ES2.

The gain circuit 3 includes the transistors T3 and T4 of the high cut-off frequency, insulated collector, vertical pnp type; consequently, that volage amplification would be achieved within a fairly wide range of frequencies but for the limitation from the junction parasitic capacitances SC1 and SC2 of the transistor T4 which introduce attenuations at high frequencies.

The output circuit 4 makes the voltage available at the output terminal U which is developed at the node A but with a sufficiently low impedance.

The device of this invention, comprising the complementary transistor pair T9 and T10, powered in said output circuit 4, exhibits on the emitters E9 and E10 the same voltage as appears at the node A, which is supplied over the lead 10 to the n epitaxial layer of the transistor T4 in the gain circuit 3.

Thus, there is imposed across the junction capacitance SC1 one and the same voltage, and the effect from SC1 cancels out.

The current required to charge the capacitance SC2 when using the inventive circuit disclosed herein is the equal of that required to charge a capacitance Cx placed on the node A and whose value is equal to the value of SC2 divided through the product p× n, where n is the current gain of the npn transistor T9, and p is the current gain of the pnp transistor T10.

With this provision, the effect from SC2 on the node A is reduced by a factor p× n over the instance where the inventive circuit is not used.

With the device of this invention, the overall performance of the broadband amplifier is improved considerably, In particular, the high performance capabilites of insulated collector vertical pnp transistors, relatively to their high-frequency response, are best utilized by reducing their parasitic capacitances.

Furthermore, through the use of this device, improvements of up to 100% are to be obtained n the rate of voltage change at the node A in the instance of high amplitude signals.

The increase in circuit complexity is virtually negligible, as are space requirements, because both T9 and T10 have minimal areas, they only being required to drive the load represented by SC2; T10 could be a pnp transistor whose collector is uninsulated from the substrate, since its collector is grounded.

I claim:

1. A broadband amplifier comprising;
   a differential amplifier;
   a gain circuit connected to said differential amplifier and including an insulated collector vertical PNP transistor having an n-epitaxial layer and having a terminal connected to said n-epitaxial layer, and with a final stage comprising a complementary pair formed by an NPN and a PNP transistor with interconnected emitters; and a low impedence output circuit connected to the gain circuit and comprising a circuit device comprising an additional complementary pair connected in parallel with the firstmentioned complementary pair and formed by an NPN and a PNP transistor with interconnected emitters which are connected to said terminal of the n-epitaxial layerof the vertical PNP transistor incorporated to the gain circuit, whereby the circuit device is effective to improve frequency response of the amplifier.

* * * * *